United States Patent
Suzuki et al.

(10) Patent No.: US 8,778,232 B2
(45) Date of Patent: Jul. 15, 2014

(54) LEAD-FREE CONDUCTIVE COMPOUND FOR SOLAR CELL ELECTRODES

(75) Inventors: Yuko Suzuki, Nagoya (JP); Takahiro Sugiyama, Nagoya (JP); Yasushi Yoshino, Nagoya (JP); Takehiro Nakao, Nagoya (JP)

(73) Assignee: Noritake Co., Limited, Nagoya (JP)

( * ) Notice: Subject to any disclaimer, the term of this patent is extended or adjusted under 35 U.S.C. 154(b) by 201 days.

(21) Appl. No.: 13/387,520

(22) PCT Filed: May 28, 2010

(86) PCT No.: PCT/JP2010/059154
§ 371 (c)(1),
(2), (4) Date: Feb. 17, 2012

(87) PCT Pub. No.: WO2011/013440
PCT Pub. Date: Feb. 3, 2011

(65) Prior Publication Data
US 2012/0138872 A1   Jun. 7, 2012

(30) Foreign Application Priority Data
Jul. 30, 2009 (JP) .................. 2009-177493

(51) Int. Cl.
*H01B 1/22* (2006.01)
*H01L 31/0224* (2006.01)
*C03C 3/064* (2006.01)
*C03C 8/18* (2006.01)

(52) U.S. Cl.
CPC ......... *H01L 31/022425* (2013.01); *Y02E 10/52* (2013.01); *C03C 3/064* (2013.01); *C03C 8/18* (2013.01)

USPC .......................................... 252/512; 252/514

(58) Field of Classification Search
USPC .................................... 252/512–514
See application file for complete search history.

(56) References Cited

U.S. PATENT DOCUMENTS

| 5,939,343 A * | 8/1999 | Tunker et al. .................... 501/17 |
| 6,171,987 B1 * | 1/2001 | Hormadaly ..................... 501/26 |
| 6,787,068 B1 * | 9/2004 | Mears ............................ 252/512 |
| 2006/0231801 A1 | 10/2006 | Carroll et al. |

(Continued)

FOREIGN PATENT DOCUMENTS

| CN | A-1873836 | 12/2006 |
| JP | A-2002-270035 | 9/2002 |

(Continued)

OTHER PUBLICATIONS

International Search Report issued in International Application No. PCT/JP2010/059154 dated Jun. 29, 2010.

(Continued)

*Primary Examiner* — Mark Kopec
(74) *Attorney, Agent, or Firm* — Oliff PLC

(57) ABSTRACT

A lead-free conductive compound for a solar cell electrode including: a conductive powder; a glass frit; and a vehicle; the glass fit includes at least one kind of lead-free glass including 10 to 29 (mol %) of $Bi_2O_3$, 15 to 30 (mol %) of ZnO, 0 to 20 (mol %) of $SiO_2$, 20 to 33 (mol %) of $B_2O_3$, and a total sum 8 to 21 (mol %) of $Li_2O$, $Na_2O$ and $K_2O$ which are contained in a ratio with respect to a whole of a glass compound in terms of oxides.

7 Claims, 1 Drawing Sheet

(56) References Cited

U.S. PATENT DOCUMENTS

| | | |
|---|---|---|
| 2006/0231804 A1 | 10/2006 | Wang et al. |
| 2008/0223446 A1 | 9/2008 | Wang et al. |
| 2011/0155240 A1 | 6/2011 | Wang et al. |

FOREIGN PATENT DOCUMENTS

| | | |
|---|---|---|
| JP | A-2006-313744 | 11/2006 |
| JP | A-2006-332032 | 12/2006 |
| JP | A-2007-246382 | 9/2007 |
| JP | A-2008-109016 | 5/2008 |
| JP | A-2008-543080 | 11/2008 |
| JP | A-2009-038022 | 2/2009 |
| WO | WO 2006/132766 A2 | 12/2006 |
| WO | WO 2008/078374 A1 | 7/2008 |
| WO | WO 2009/041182 A1 | 4/2009 |

OTHER PUBLICATIONS

Office Action issued in Japanese Patent Application No. 2009-177493 mailed Feb. 5, 2013 (with partial translation).

Nov. 12, 2013 Questioning issued in Japanese Patent Application No. 2009-177493 w/partial translation.

Apr. 1, 2014 Office Action issued in Chinese Patent Application No. 201080043514.5 w/partial translation.

\* cited by examiner

LEAD-FREE CONDUCTIVE COMPOUND FOR SOLAR CELL ELECTRODES

FIELD OF THE INVENTION

This invention relates to an electrically conductive compound suited for a solar cell electrode formed by a fire through method.

BACKGROUND OF THE INVENTION

For instance, silicon-based solar cells, used in general practice, have been formed in structures wherein a silicon substrate, composed of a p-type multicrystalline semiconductor, has: an upper surface provided with an anti-reflection film and a light-receiving surface electrode formed via an $n^+$ layer; and a lower surface provided with a rear surface electrode via a $p^+$ layer (hereinafter, these electrodes will be merely referred to as "electrodes" unless otherwise specified). The anti-reflection film serves to decrease a surface reflection rate while keeping an adequate visible light transmission rate and includes a thin film composed of silicon nitride, titanium dioxide and silicon dioxide, etc.

The light-receiving surface electrode of the solar cell is formed in a process referred to as, for instance, fire through. In such an electrode forming method, for instance, the anti-reflection film is formed on the $n^+$ layer over an entire surface thereof, after which a conductive paste is coated on the anti-reflection film in a suitable shape using, for instance, a screen printing method and, subsequently, firing treatment is conducted. With such a method, steps become simpler than those of a case wherein the anti-reflection film is removed in part and an electrode is formed in such a removed area, an issue of a positional misalignment between the removed area and an electrode forming position does not occur. The conductive paste has a principal composition including, for instance, silver powder, glass frit (flake-like or powder-shaped glass fragments obtained by melting glass raw materials, quenching the melted glass and crashing the quenched glass depending on needs), an organic vehicle and an organic solution. In a firing process, the glass components, present in the conductive paste, break the anti-reflection film by etching, resulting in the formation of an ohmic contact between a conductive component, present in the conductive paste, and the $n^+$ layer (see, for instance, Patent Publication 1).

With such a light-receiving surface electrode forming method, accordingly, it has been found desirable to improve the ohmic contact as well as increasing Fill Factor (FF) and energy conversion efficiency. To realize these, various attempts have been made in the art to perform improvements for increasing fire through properties.

PUBLICATIONS ON PRIOR ART

Patent Publications

Patent Publication 1: Japanese Patent Application Publication No. 2006-332032

Patent Publication 2: Japanese Patent Application Publication No. 2008-109016

Patent Publication 3: Japanese Patent Application Publication No. 2006-313744

Patent Publication 4: Japanese Patent Application Publication No. 2008-543080

SUMMARY OF THE INVENTION

Problems to be Solved by the Invention

Meanwhile, it has been a practice for lead-free glass, having no lead, to be used in various fields which concerns about environmental issues, but lead glass still remained in use for the application set forth above. This is because when the lead-free glass is used for the conductive paste to form the light-receiving surface electrode by a fire through method, a firing temperature may become higher than that of a case using lead glass and deterioration in electrical characteristics may occur due to a difficulty to arise in obtaining an adequate ohmic contact. Various attempts have heretofore been made in the related art for improvements of the firing temperature and fire through characteristic when using lead-free glass. However, none of such attempts to have adequate characteristics have still ended in failures.

For instance, an attempt has been made to propose a conductive compound, using lead-free glass frit composed of Bi-based glass including a principal component composed of $Bi_2O_3$, $B_2O_3$ and $SiO_2$, which is proposed to have increased electrical performance by adding Zn-containing additive such as ZnO or the like (see Patent Publication No. 1). For such a conductive compound, it is regarded to be preferable for the amount of Zn-containing additive to be in a range up to 10 (wt %) for a whole compound and for the additive to have an average particle diameter to be less than 0.1 ($\mu$m). In terms of a bonding force, etc., of the electrode, it is preferable to have less content of Zn-containing additive. In order for an effect to be obtained with such less content, it is preferable to use those which are formed in fine structures. However, the use of such additive in less content and fine structure results in poor dispersion ability with a resultant occurrence to be difficult in handling.

Further, an attempt has been made to propose a silver paste for a solar cell element with the use of glass frit including 5 to 10 (wt %) of ZnO, 70 to 84 (wt %) of $Bi_2O_3$ and 6 (wt %) or more of $B_2O_3+SiO_2$ (see Patent Publication No. 2). The purpose of this silver paste is to increase bonding strength with respect to the substrate and long-term reliability. However, even when using the glass frit with the principal component falling in the range of the above-described composition, no intended bonding strength could be necessarily obtained and, in addition, no adequate electrical characteristic could be obtained.

For using lead-free glass for application to solar cell electrodes, furthermore, a thick-film conductive compound has been proposed in the art including: either one of Al, Cu, Au, Ag, Pd and Pt, or alloys thereof; or metallic particles of a mixture of such elements; lead-free glass; and an organic medium (see Patent Publication No. 3). Examples of lead-free glass have been shown to include a composition with a ratio ranging from 0.5 to 35 (wt %) of $SiO_2$, 1 to 15 (wt %) of $B_2O_3$, 55 to 90 (wt %) of $Bi_2O_3$, 0 to 15 (wt %) of ZnO and 0 to 5 (wt %) of $Al_2O_3$. When the rear surface electrode is formed of Al, then, no lead can be soldered, whereas when forming a bus bar with Ag or Ag/Al, a rear surface electric field is impaired. Thus, such a conductive compound has been proposed with a view to forming the electrodes with no occurrence of such issues. However, the purpose of such a conductive compound was to improve the rear surface electrode and no consideration has been taken for fire through property and electrical characteristic or the like when applied to the light-receiving surface electrode. Thus, such a composition, mentioned above, still has an issue in which, for instance, the softening point is excessively high.

Moreover, a light-receiving surface electrode has been proposed including 85 to 99 (wt %) of conductive metal components and 1 to 15 (wt %) of glass component that includes 5 to 85 (wt %) of $Bi_2O_3$ and 1 to 70 (mol %) of $SiO_2$ (see Patent Publication No. 4). The purpose of this light-receiving surface electrode is to obtain an adequate ohmic contact at a low firing temperature even when lead-free glass is employed. The glass component is regarded to preferably have a ratio in ranges of 0.1 to 30 (mol %) of $V_2O_5$, 1 to 20 (mol %) of trivalent metal oxides of Al and B or the like, 1 to 15 (mol %) of tetravalent metal oxides of Ti, Zr and Hf, 0.1 to 20 (mol %) of pentavalent metal oxides of P, Ta, Nb and Sb, 0.1 to 20 (mol %) of alkaline metal oxides, 0.1 to 20 (mol %) of alkaline rare earth metal oxides, 0.1 to 25 (mol %) of ZnO, and 0.1 to 12 (mol %) of $Ag_2O$. However, the glass composition, recited in scopes of claims, is remarkably broad and no composition was specified to be appropriate for the formation of such a light-receiving surface electrode based on fire through. Meanwhile, some concrete glass compositions were described in the embodiments, the use of any of such glasses resulted in inadequate electrical characteristic or the softening point was too high and it was difficult to be used for the light-receiving electrode.

The present invention has been completed with the above view in mind and has an object to provide a lead-free conductive compound for a solar cell electrode enabling the formation of an electrode with excellent electrical characteristic.

Means for Solving the Problems

To achieve the object, the present invention provides a lead-free conductive compound for a solar cell electrode comprising: a conductive powder; a glass frit; and a vehicle; (a) the glass frit comprising at least one kind of lead-free glass including 10 to 29 (mol %) of $Bi_2O_3$, 15 to 30 (mol %) of ZnO, 0 to 20 (mol %) of $SiO_2$, 20 to 33 (mol %) of $B_2O_3$, and a total sum 8 to 21 (mol %) of $Li_2O$, $Na_2O$ and $K_2O$ which are contained in a ratio with respect to a whole of a glass compound in terms of oxides.

Effect of the Invention

With such an aspect, the lead-free conductive compound for the solar cell electrode, formed of glass fit constituting such a compound, includes lead-free glass. Forming the electrodes of the solar cell with the use of such a composition makes it possible to obtain electrodes which are lead-free with excellent electrical characteristics.

In the glass frit composition noted above, further, $B_2O_3$ is glass-forming oxide (that is, a constituent for creating a frame of glass) to be essential for lowering the softening point of glass. If less than 20 (mol %), the softening point has a value that is too high and if exceeded a value of 33 (mol %), then, the solar cell has inadequate electrical characteristic. The less the amount of $B_2O_3$, the higher will be the softening point and the greater the amount of $B_2O_3$, the lower will be the electrical characteristic (that is, it is considered that such a phenomenon is derived from the occurrence of an increase in reaction with Si serving as a substrate material in, for instance, a silicon-based solar cell). Thus, such a relevant ratio may be preferably determined in consideration desired the softening point and desired electrical characteristic to fall in a value of, for instance, 30 (mol %) or less.

Moreover, $Bi_2O_3$ acts as a component to lower the softening point of glass to be essential for low temperature firing to be enabled. If less than 10 (mol %), the softening point has a value that is too high and if exceeded a value of 29 (mol %), then, electrical characteristic of the solar cell becomes inadequate. For the electrical characteristic to be as high as possible, less amount of $Bi_2O_3$ is preferable and it is further preferable for such a composition to remain in a value of 20 (mol %) or less. For the softening point to be sufficiently lowered, the inclusion of a large amount of $Bi_2O_3$ is preferable to be 15 (mol %) or more. That is, a range of 15 to 20 (mol %) is particularly preferred.

Further, ZnO serves as a component for lowering a softening point of glass while increasing durability (i.e., long-term reliability). If ZnO remains less than 15 (mol %), then, the softening point reaches an excessively high value with resultant occurrence of inadequate durability. In contrast, if ZnO exceeds 30 (mol %), then, an adverse affect arises on a balance with other components but glass tends to easily crystallize. The less the amount of ZnO, the higher will be the softening point with a decrease in durability. Meanwhile, the greater the amount of ZnO, the more likely will be the occurrence of crystallization. Thus, it is more preferable for ZnO to be present in an amount of 20 (mol %) or more and, more preferably, in an amount of 30 (mol %) or less. That is, it is particularly preferable for ZnO to be present in a range of 20 to 30 (mol %).

The alkaline components ($Li_2O$, $Na_2O$ and $K_2O$) serve to lower the softening point of glass. If a total sum of these components remains less than 8 (mol %), then, the softening point reaches an excessively high value. In contrast, if the total sum of these components exceeds 21 (mol %), then, a solar cell has an inadequate electrical characteristic. The less the amount of alkaline components, the higher will be the softening point. Meanwhile, the greater the amount of alkaline components, the lower will be electrical characteristic. Thus, it is more preferable for the alkaline components to be present in an amount of 10 (mol %) or more and, more preferably, in an amount of 20 (mol %) or less. That is, it is particularly preferable for the alkaline components to be present in a range of 10 to 20 (mol %).

Further, $SiO_2$, serving as glass forming oxide to be effective to improve stability of glass, is not an essential component but it is preferable to be contained. However, the greater the amount of this component, the higher will be the softening point and, hence, the amount of this component may preferably fall in an amount of 20 (mol %) or less. In order to obtain adequate stability, it is more preferable for this component to be present in an amount of 4 (mol %) or more and, in order to allow the softening point to remain at a sufficiently low level, it is more preferable for this component to be present in an amount of 11 (mol %) or less. That is, it is particularly preferable for this component to be present in a range of 4 to 11 (mol %).

Furthermore, although it is necessarily difficult to specify if the respective components are contained in glass in any form, all of these ratios are assigned to have values converted in terms of oxides.

The glass constituting the conductive compound in the present invention may include other various glass forming constituents and additives in a range of not deteriorating the characteristic. For instance, it may include $Al_2O_3$, $P_2O_5$, alkaline earth metal oxides and other compounds. If a large amount of these components are present, then, a solar cell has deteriorated electrical characteristic and, hence, a total amount of these components may be included in an amount of, for instance, 20 (mol %) or less.

Preferably, the glass frit has an average particle diameter of 3.0 (μm) or less in the lead-free conductive compound for the solar cell electrode. With such an aspect, it becomes possible to obtain a conductive compound that has a further favorable printing capability with a higher F.F. value. In addition, if the glass frit has an average diameter of, for instance, 0.5 (μm) or more, further improved dispersing capability can be obtained during the blending of the paste, resulting in an increase in productivity.

Preferably, the lead-free conductive compound for the solar cell electrode, which has the glass frit being contained in a ratio ranging from 2 to 6 (wt %) with respect to a whole of the paste. The greater the amount of glass frit, the higher will be the solubility of the anti-reflection film with resultant improvement in fire through property and, in contrast, the greater the amount of glass frit, the higher will be the resistance value with a resultant drop in solar cell output. In order to have a sufficiently high fire through property, therefore, it is preferable for the amount of glass frit to fall in a value of 2 (wt %) or more, whereas in order to have a sufficiently high solar cell output, it is preferable for the amount of glass frit to remain a value of 6 (wt %) of less.

Preferably, the conductive powder includes silver powder. Although examples of conductive powder may also include copper powder and nickel powder or the like, it is most preferable to use silver powder because high conductivity can be obtained.

Preferably, the lead-free conductive compound for the solar cell electrode, which includes the silver powder by 64 to 90 weight parts and the vehicle by 5 to 20 weight parts. With such an aspect, it becomes possible to obtain a conductive compound that can fabricate an electrode having favorable printing properties, high conductivity and favorable solder wettability. If silver powder is present in less content, no high conductivity can be obtained. If the amount of silver powder is present in excess, a drop occurs in fluidity with resultant deterioration in printing properties. In addition, if glass frit is present in less content, then, the substrate has a shortage in bonding strength and if the amount of glass frit is present in excess, then, glass floats on an electrode surface after firing treatment with resultant deterioration in solder wettability.

The silver powder is not limited, particularly, and even when it is used a powder in the any form of a spherical shape and a flake shape or the like in shape, it can enjoy the basic effect in the present invention that optimum firing temperature ranges are expanded. If those of, for instance, spherical shapes are used, however, excellent printing properties can be obtained with an increase in charging rate of silver powder in a coated film. In association with the use of silver having high conductivity, this allows an electrode, created by such a coated film, to have a further increased conductivity than that of the electrode using silver powder formed in other shapes such as flakes or the like. Therefore, it becomes possible for a line width to be further thinned with enhanced necessary conductivity. Accordingly, if such a conductive compound is applied to a light-receiving surface electrode in the presence of a thin line width, there occurs a further increase in a light-receiving surface area that can absorb solar energy, thereby making it possible to obtain a solar cell having further increased conversion efficiency.

The conductive compound in the present invention can preferably be used to a light-receiving surface electrode because it can preferably control the diffusion of silver can be obtained during the formation of an electrode in fire through method as described above. However, it is used as not only the light-receiving surface electrode, but also a rear surface electrode.

Although the rear surface electrode is comprised of an aluminium film covering an entire surface of and band-like electrodes overlapping this film, for instance, the conductive compound of the present invention can be suitably applied to the band-like electrode as forming material.

Further, the glass frit can be synthesized from various materials vitrifiable in a range of the compound described above and examples of this component include, for instance, oxides, carbonates and nitrates, etc. For instance, bismuth oxide is used as a Bi-source; zinc oxide as a Zn-source; silicon dioxide as a silicon source; boric acid as a B-source; lithium carbonate as a Li-source; sodium carbonates as a Na-source; and potassium carbonate as a K-source.

If the glass frit is comprised of other components such as Al, P, alkaline earth metal and other compounds in addition to the principal components of Bi, Zn, Si, B and alkaline metal, moreover, for instance, oxides, hydroxides, carbonates and nitrates of these components may suffice to be employed.

BEST MODE FOR CARRYING OUT THE INVENTION

Now, one embodiment of the present invention will be described below in detail with reference to the accompanying drawings. Throughout the drawings, the embodiment is suitably simplified or modified in view with none of various parts being necessarily and precisely drawn in dimensional ratios and shapes or the like.

Figure 1:
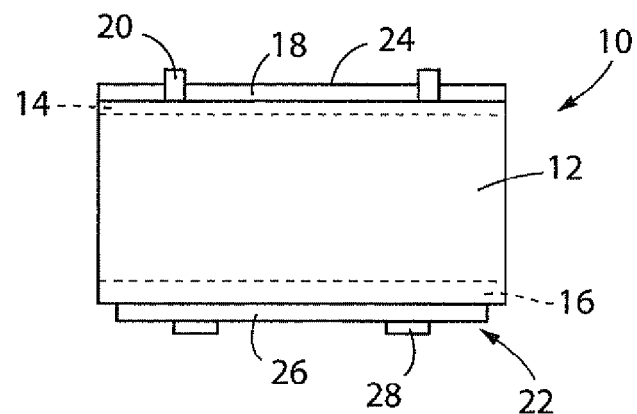
FIG. 1 is a view typically showing a cross-sectional structure of a solar cell to which a electrode paste compound of one embodiment of the present invention is applied to the formation of a light-receiving surface electrode.

FIG. 1 is a view typically showing a cross-sectional structure of a silicon-based solar cell 10 to which a conductive compound of one embodiment of the present invention is applied. In FIG. 1, the solar cell 10 is shown to include a silicon substrate 12 in the form of, for instance, a p-type multicrystalline semiconductor, an $n^+$ layer 14 and a $p_+$ layer 16 formed on the silicon substrate 12 at upper and lower surfaces thereof respectively, a reflection preventing layer 18 and a light-receiving surface electrode 20 formed on the $n^+$ layer 14, and a rear surface electrode 22 formed on the player 16

The $n^+$ layer 14 and the $p^+$ layer 16 are provided by forming layers on the upper and lower surfaces of the silicon substrate 12 with impurities in high concentrations. The thickness dimensions of the high concentration layers, i.e., the thickness dimensions of the layers 14 and 16, are, for instance, on the order of about 0.5 (μm), respectively. The $n^+$ layer 14 has impurity of, for instance, phosphate (P) in the form of an n-type dopant and the $p^+$ layer 16 has impurity of, for instance, boron in the form of a p-type dopant.

Further, the reflection preventing layer 18, formed of a thin film made of, for instance, silicon nitride $Si_3N_4$ or the like, is provided with an optical thickness on the order of, for instance, about one fourth of a visible light wavelength to have an extremely low reflection rate less than 10 (%), such as about 2 (%).

Figure 2:
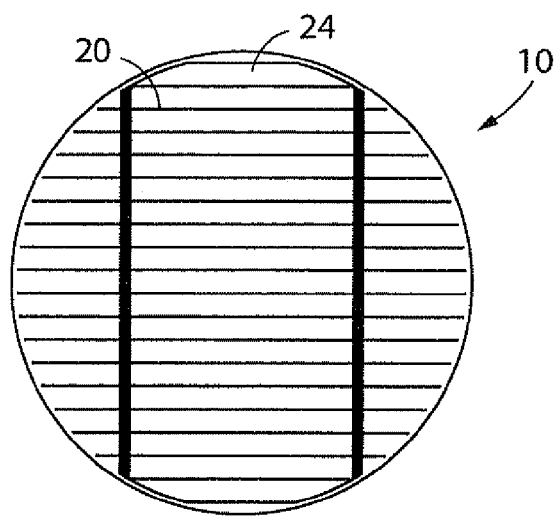
FIG. 2 is a view showing a example of patterns for the light-receiving surface electrode of the solar cell in FIG. 1.

Furthermore, the light-receiving surface electrode 20 is formed of, for instance, a thick-film conductive body with a uniform thickness in dimension and, as shown in FIG. 2, is formed on a nearly whole of a light-receiving surface 24 in a coplanar configuration with comb-shaped gratings having a large number of thin wired portions. The thick-film conductive body is made of thick-filmed silver containing Ag on the order of about 88 to 99 (wt %) and glass on the order of about 1 to 12 (wt %). This glass includes lead-free glass having ratios within 10 to 29 (mol %) of $Bi_2O_3$, 15 to 30 (mol %) of ZnO, 20 (mol %) or less of $SiO_2$, 20 to 33 (mol %) of $B_2O_3$ and a total amount of 8 to 21 (mol %) of alkaline components ($Li_2O$, $Na_2O$ and $K_2O$) in terms of oxide-conversion values. Moreover, the thickness of the conductive body layer falls in a range of, for instance, 15 to 20 (μm), i.e., on the order of, for instance, about 17 (μm) with each thin wired portion having a width in a range of, for instance, 80 to 130 (μm), i.e., on the order of, for instance, about 100 (μm) to have sufficiently high conductivity.

Besides, the rear surface electrode 22 includes a whole-surface electrode 26 formed on the $p^+$ layer 16 in a nearly whole surface thereof upon applying the same with thick film material consisting of aluminum as a conductive component, and band-like electrodes 28 made of thick-filmed silver formed by applying on the whole-surface electrode 26 in band shapes, respectively. The band electrodes 28 are provided to allow conductive wires or the like to be soldered onto the rear surface electrode 22.

With the solar cell 10 formed in such a structure, the light-receiving surface electrodes 20 is made of thick-filmed silver containing 1 to 12 (wt %) of lead-free glass in the composition mentioned above. This provides advantageous effects with superior electrical characteristics than those of a related art solar cell employing lead-free glass while having an F.F. value of 74 (wt %) or more on the same order as that of, for instance, a case in which lead glass is employed.

As set forth above, the light-receiving surface electrode 20 is formed in a well-known fire through method using electrode paste made of, for instance, conductive powder, glass frit, a vehicle and a solvent. One example of a method of manufacturing the solar cell 10 including such a method of forming a light-receiving surface electrode will be described below in connection with comparative examples of a method of manufacturing electrode paste.

First, the glass frit is prepared. Various sources are prepared including bismuth oxide as a Bi-source, zinc oxide as a Zn-source, silicon dioxide as a Si-source, boric acid as a B-source, lithium carbonate as a Li-source, sodium carbonate as a Na-source, potassium carbonate as a K-source, aluminum oxide an Al-source, $NH_4H_2PO_4$ as a P-source, calcium oxide CaO as a Ca-source, and $BaCO_3$ as a Ba-source, which were weighed and blended in compositions shown in embodiments of Table 1. Moreover, the respective raw materials may take any forms of oxides, hydroxides, carbonates or nitrates but may be preferable to be used in finely pulverized raw materials in view of preferable melting. These were poured into a crucible for melting at temperatures ranging from 900 to 1400 (° C.) depending on the relevant compositions for time intervals of, for instance, 20 minutes to one hour for glass formation. Resulting glass was pulverized using a suitable pulverizing device such as a pot mill or the like, thereby obtaining powders with average particle diameters of 0.4 (μm), 0.6 (μm), 1.5 (μm), 3.0 (μm) and 4.0 (μm), respectively.

TABLE 1

| | COMPOSITIONS (mol %) | | | | | | | | | | | AMOUNT OF ADDED GLASS | | Humid. |
|---|---|---|---|---|---|---|---|---|---|---|---|---|---|---|
| | $Bi_2O_3$ | $B_2O_3$ | $SiO_2$ | $Al_2O_3$ | ZnO | CaO | BaO | $Li_2O$ | $Na_2O$ | $K_2O$ | $P_2O_5$ | (wt %) | F.F. (%) | Resist |
| Com. Exam 1 | 52.0 | 29.0 | — | — | 8.0 | — | 11.0 | — | — | — | — | 5.0 | 67.0 | — |
| Com. Exam 2 | 45.0 | 6.0 | 1.0 | — | 20.0 | — | 11.0 | 17.0 | — | — | — | 5.0 | 55.0 | — |
| Com. Exam 3 | 30.0 | 5.0 | 5.0 | 5.0 | 30.0 | — | 10.0 | — | — | — | 15.0 | 5.0 | 68.0 | — |
| Com. Exam 4 | 35.0 | 50.0 | 5.0 | — | — | — | — | 7.0 | 3.0 | — | — | 5.0 | 52.0 | — |
| Com. Exam 5 | 50.0 | 29.0 | 4.0 | — | — | — | — | 17.0 | — | — | — | 5.0 | 65.0 | — |
| Com. Exam 6 | 38.0 | 10.0 | — | — | 24.0 | — | 11.0 | 17.0 | — | — | — | 5.0 | 58.0 | — |
| Com. Exam 7 | 48.0 | 29.0 | — | — | 5.0 | — | 11.0 | 7.0 | — | — | — | 5.0 | 63.0 | — |
| Com. Exam 8 | 5.0 | 40.0 | 21.0 | — | 16.0 | — | 5.0 | 13.0 | — | — | — | 5.0 | 62.0 | — |
| Com. Exam 9 | 15.0 | 22.0 | — | — | 55.0 | — | — | 6.0 | 2.0 | — | — | 5.0 | 53.0 | — |
| Com. Exam 10 | 24.0 | 35.0 | 5.0 | — | 36.0 | — | — | — | — | — | — | 5.0 | 62.0 | — |
| Com. Exam 11 | 10.0 | 15.0 | 10.0 | 3.0 | 50.0 | — | — | 12.0 | — | — | — | 5.0 | 70.0 | — |
| Com. Exam 12 | 10.0 | 33.0 | 10.0 | — | 30.0 | — | — | 17.0 | — | — | — | 1.0 | 70.0 | — |
| Com. Exam 13 | 10.0 | 33.0 | 10.0 | — | 30.0 | — | — | 17.0 | — | — | — | 7.0 | 72.0 | — |
| Com. Exam 14 | 20.0 | 29.0 | 24.0 | — | 10.0 | — | — | 17.0 | — | — | — | 5.0 | 75.0 | X |
| Embod. 1 | 29.0 | 29.0 | — | — | 15.0 | — | 11.0 | 16.0 | — | — | — | 5.0 | 76.0 | — |
| Embod. 2 | 20.0 | 29.0 | 4.0 | — | 30.0 | — | — | 17.0 | — | — | — | 5.0 | 77.0 | ○ |
| Embod. 3 | 22.0 | 20.0 | 20.0 | — | 15.0 | 5.0 | 5.0 | 8.0 | 5.0 | — | — | 5.0 | 76.0 | — |
| Embod. 4 | 22.0 | 20.0 | 17.0 | 3.0 | 15.0 | 5.0 | 5.0 | 8.0 | — | — | 5.0 | 5.0 | 76.0 | — |
| Embod. 5 | 15.0 | 30.0 | 4.0 | — | 30.0 | — | — | 16.0 | — | 5.0 | — | 5.0 | 77.0 | — |
| Embod. 6 | 17.0 | 27.0 | 10.0 | 4.0 | 26.0 | — | — | 16.0 | — | — | — | 5.0 | 75.0 | — |
| Embod. 7 | 15.0 | 26.0 | 10.5 | 3.0 | 28.5 | — | — | 17.0 | — | — | — | 5.0 | 77.0 | ○ |
| Embod. 8 | 10.0 | 33.0 | 10.0 | — | 30.0 | — | — | 17.0 | — | — | — | 5.0 | 76.0 | — |
| Embod. 9 | 10.0 | 33.0 | 10.0 | — | 30.0 | — | — | 17.0 | — | — | — | 2.0 | 76.0 | — |
| Embod. 10 | 10.0 | 33.0 | 10.0 | — | 30.0 | — | — | 17.0 | — | — | — | 3.0 | 76.0 | — |
| Embod. 11 | 10.0 | 33.0 | 10.0 | — | 30.0 | — | — | 17.0 | — | — | — | 6.0 | 76.0 | — |

Further, as the conductive powder noted above, commercially available sphere silver powder with an average diameter of, about 2 (μm) among a range from 0.5 to 3 (μm) was prepared. Using silver powder with such a sufficiently small average diameter enabled a coated film to have an increased filling rate of silver powder with a resultant increase in conductive rate of a conductive body. Furthermore, the vehicle mentioned above was prepared by dissolving an organic bonding solvent into an organic solution with the organic solution including, for instance, butyl carbitol acetate while the organic bonding solvent including, for instance, ethyl cellulose. The vehicle contained ethyl cellulose in the order of, for instance, about 15 (wt %). Moreover, a solvent added in addition to the vehicle was, for instance, butyl carbitol acetate. That is, though the present invention is not limited by such a compound, it may suffice to use the same compound as that used in the vehicle. This solvent is added for the purpose of adjusting viscosity of the paste.

Paste raw materials, set forth above, were prepared, respectively, upon which, for instance, 80 weight parts of conductive powder, 10 weight parts of vehicle, suitable amounts of solvent and additive and 2 to 6 weight parts (wt %) of glass frit for a whole of the paste were weighed for mixing using a stirrer or the like. Thereafter, dispersion treatment was carried out by using, for instance, three roller mills. This allowed the electrode paste to be obtained. Table 1 shows results in compile of compositions of glass frits used in various embodiments and comparative examples, the relevant amounts (wt %) of additives used in terms of the whole pastes, and measured results on F.F. values of solar cells 10 when formed with the light-receiving surface electrodes 20 using such respective glass frits.

The electrode pastes were prepared in such manners described above, while impurities were dispersed in or charged into a well-known method like, for instance, a thermal dispersion method and ion-plantation or the like to form $n^+$ layers 14 and $p^+$ layers 16 for preparation of respective silicon substrates 12. Then, silicon nitride ($SiN_x$) thin films were formed on the respective substrates in a suitable method like, for instance, spin-coating or the like, upon which antireflection films 18 were provided.

Next, the electrode paste was screen printed on anti-reflection films 18 in a pattern shown in FIG. 2. Resulting object was dried at a temperature of, for instance, 150 (° C.) and, thereafter, subjected to firing treatment in a near infrared radiation furnace at temperatures ranging from 650 to 900 (° C.). This caused glass components in the electrode pastes to melt the anti-reflection films 18 in the firing process to cause such electrode paste to break the anti-reflection films 18. This caused the conductive component, i.e., silver, contained in the electrode pastes to be brought into electrical contact with the $n^+$ layer 14, thereby obtaining ohmic contact between the silicon substrate 12 and the light-receiving surface electrode 20 in a shape shown in FIG. 1. The light-receiving surface electrodes 20 were formed in such a way.

Further, although the rear surface electrode 22 may be formed after the process noted above has been finished, the rear surface electrode 22 may be formed simultaneously when firing the light-receiving surface electrode 20. In forming the rear surface electrode 20, an entire rear surface of the silicon substrate 12 was applied with, for instance, aluminium paste by a screen printing method or the like, upon which firing treatment was conducted for forming the whole surface electrode 26 composed of an aluminium thick film. In addition, the electrode paste was coated on a surface of the whole surface electrode 26 in a band-like shape using the screen printing method or the like, after which firing treatment was conducted for formation of the band-like electrodes 28. This resulted in the formation of the rear surface electrodes 22 including the whole surface electrodes 26 covering the whole rear surface, and the band-like electrodes 28 formed on such a surface in part in the band-like shape, thereby obtaining the solar cells 10. When performing the production in cofiring on the process mentioned above, printing treatments were carried out before firing the light-receiving surface electrodes 20.

The F.F. values, indicated on Table 1 at the right on a second row, were obtained by measuring outputs of the resulting solar cells 10 of the embodiments and the comparative examples, provided in composition of glass and the amounts of additives in various modifications: which were fired at firing temperatures recognized to be optimum for forming the light-receiving surface electrodes 20, respectively. Moreover, the outputs of the solar cells 10 were measured by using a commercially available solar simulator. In addition, for "F.F. values after Humidity Resistance Test" indicated on Table 1 at the rightmost column, accelerated testing was conducted for the solar cells which were retained under high temperatures and high humidity at a temperature of 85 (° C.) and humidity of 85 (%) for 1000 hours. Then, evaluations were made such that those of the F.F. values after the tests falling at a change rate of 5% or less were evaluated to have humidity resistance (in evaluation to be "o") and those exceeding a value of 5 (%) were evaluated not to have humidity resistance (in evaluation to be "x").

The solar cells are available to be used provided that the F.F. values fall in a value of 74 (%) or more but it is of course preferable for the solar cells to have the F.F. values that are as high as possible. All of the embodiments 1 to 11 in Table 1 were confirmed that the F.F. values were 75 (%) or more with sufficiently high characteristics in level equal to those of cases employing lead glass.

That is, according to the evaluation results indicated in Table 1, the F.F. values become adequately high provided that a total sum of 10 to 29 (mol %) of $Bi_2O_3$, 20 to 33 (mol %) of $B_2O_3$, 20 (mol %) or less of $SiO_2$, 15 to 30 (mol %) of ZnO, 8 to 21 (mol %) of alkaline components (a sum of $Li_2O$, $Na_2O$ and $K_2O$) and other components ($Al_2O_3$, CaO, BaO and $P_2O_5$) falls in a range of 18 (mol %) or less.

Moreover, according to the embodiments 2, 5 and 7, it becomes possible to obtain the F.F. value of 77.0 (%) provided that a total sum of 15 to 20 (mol %) of $Bi_2O_3$, 26 to 33 (mol %) of $B_2O_3$, 4 to 17 (mol %) of $SiO_2$, 28.5 to 30 (mol %) of ZnO, 17 to 21 (mol %) of alkaline components (a sum of $Li_2O$, $Na_2O$ and $K_2O$) and other components ($Al_2O_3$, CaO, BaO and $P_2O_5$) falls in a range of 3 (mol %) or less.

Moreover, all of the embodiments 1 to 11 were confirmed that a variation in F.F. values after the humidity resistance tests remains to be 5 (%) or less with enhanced adequate long-term reliability.

In contrast, the comparative examples 1 to 10 had the F.F. values remained to be less than 70 (%). It is considered that the comparative examples 1, 3 and 7 contained the amount of $Bi_2O_3$ in excess with a resultant decrease in electrical characteristic while less amount of ZnO was present and alkaline components remained in less amount or zeroed value with a resultant excessively increase in softening point to cause a drop in F.F. values. Further, it is conceived that the comparative examples 2 and 6 contained the amount of $Bi_2O_3$ in excess with a resultant decrease in electrical characteristic while less amount of $B_2O_3$ was present with a resultant excessively increase in softening point to cause a drop in F.F. value. Furthermore, it is conceived that the comparative example 4 contained $Bi_2O_3$ and $B_2O_3$ in excess amounts with a resultant decrease in electrical characteristic causing a drop in F.F. value. This is deemed to arise from an adverse affect caused by reaction between an excess amount of boron and silicon constituting the substrate material. Moreover, it is conceived that the comparative example 5 had a lowered F.F. value due to the presence of $Bi_2O_3$ in excess with a resultant decrease in electrical characteristic. Besides, it is conceived that the comparative example 8 contained less amount of $Bi_2O_3$ in the presence of $SiO_2$ in excess with a resultant excessively increase in softening point while an excess amount of $B_2O_3$ was present to cause a drop in electrical characteristic with a resultant drop in F.F. value. In addition, it is conceived that the comparative example 9 had the lowered F.F. value resulting from the occurrence of crystallization of glass in excess of ZnO. Besides, it is conceived that the comparative example 10 contained an excess amount of $B_2O_3$ with a drop in electrical characteristic while an excess amount of ZnO was present with an increased likelihood of inducing the crystallization of glass whereas no alkaline component was present to cause the softening point to excessively increase with a resultant drop in F.F. value.

Further, the comparative examples 11 to 13 had the higher F.F. values than those of the comparative examples 1 to 10 but remained to be as high as 70 to 72 (%). It is considered that the comparative example 11 contained less amount of $B_2O_3$ with a resultant increase in softening point and an excess amount of ZnO was present with an increased likelihood of inducing the crystallization of glass whereby the F.F. values were lower than those of the embodiments. Furthermore, it is considered for the comparative examples 12 and 13 to have had F.F. values remained in lower values because of the reasons stated below. That is, no issue was found in glass forming ingredient ratio. However, the amount of glass additives was too small for preparing the electrode paste with a resultant difficulty caused in obtaining favorable fire, through properties and a favorable ohmic contact. Alternatively, the amount of glass additives remained in excess with a resultant increase in resistance value of the electrode material. Moreover, it is considered that the comparative example 14 had an adequately high F.F. value but was insufficient in long-term reliability because a change after humidity resistance test exceeded 5 (%). This is deemed that the softening point excessively increased in the present of too much amount of Si with resultant inadequate humidity resistance.

Furthermore, the embodiments 8 to 11 concern evaluations on the F.F. values of the solar cells 10 obtained by varying the amounts of added glass frits of the same composition in ranges from 2 to 6 (wt %) with respect to a whole of the paste. As demonstrated in these evaluation results, no variation was recognized in F.F. value regardless of the amounts of additives provided that the amounts of additives remained in the ranges from 2 to 6 (wt %). However, as indicated in the comparative examples 12 and 13 set forth above, if the amounts of additives reached the values of 1 (wt %) and 7 (wt %), respectively, then, the F.F. values slightly decreased. In order to obtain an adequately high F.F. value, therefore, the amount of glass being added may preferably fall in the ranges from 2 to 6 (wt %).

As described above, the paste for the solar cell electrode in the present embodiment, formed of glass frit constituting such a compound, includes lead-free glass 10 to 29 (mol %) of $Bi_2O_3$, 20 to 33 (mol %) of $B_2O_3$, and 20 (mol %) of $SiO_2$ or less, and 15 to 30 (mol %) of ZnO, 8 to 21 (mol %) of alkaline components (a sum of, $Li_2O$ $Na_2O$ and $K_2O$) and other components ($Al_2O_3$, CaO, BaO and $P_2O_5$) falls in a range of 18 (mol %) or less a total sum. This provides advantageous effects that forming the light-receiving surface electrodes 20 of the solar cell 10 with the use of such a composition makes it possible to obtain electrodes which are lead-free with excellent electrical characteristics of the F.F. values fall in a value of 75 (%) or more.

According to the electrode paste of the present embodiment, the amount of ZnO falls in ranges from 15 to 30 (mol %) with advantageous effects in which excellent long-term reliability is provided and a variation rate of the F.F. values subsequent to the tests, conducted at high temperatures and high humidity for a time interval of, for instance, 1000 hours, is no more than 5% or less.

Besides, the present embodiment is advantageous in that the electrode paste is specifically determined to have the amount of glass in values ranging from 2 to 6 (wt %) with almost no difference in characteristics arising from more or less amount of added glass to be capable of enjoying high electrical characteristic based on such a glass composition.

While the present invention has been described above with reference to the accompanying drawings, it is intended that the present invention can be implemented in other modes and various modifications may be possible based on knowledge of those skilled in the art.

With the present embodiment set forth above, for instance, the anti-reflection film 18 was composed of the silicon nitride film but the present invention is not specifically limited to such a component material and may be similarly composed of those including other various materials like titanium dioxide $TiO_2$, etc., which is generally used in solar cells.

While the present invention has been described above with reference to the embodiment applied to the silicon-based solar cell 10, further, the present invention is not particularly limited to such a substrate material of an applied object provided that a solar cell enables a light-receiving surface electrode to be formed by a fire through method.

The invention claimed is:

1. A lead-free conductive compound for a solar cell electrode comprising:
   a conductive powder;
   a glass frit; and
   a vehicle;
   the glass frit being contained in a ratio ranging from 2 to 6 (wt %) with respect to a whole of the compound; and
   the glass frit being a lead-free glass consisting of 10 to 29 (mol %) of $Bi_2O_3$, 15 to 30 (mol %) of ZnO, 0 to 20(mol %) of $SiO_2$, 20 to 33 (mol %) of $B_2O_3$, a total sum 8 to 21 (mol %) of $Li_2O$, $Na_2O$ and $K_2O$, 0 to 3 (mol %) of $Al_2O_3$, 0 to 5 (mol %) of CaO, 0 to 11 (mol %) of BaO, and 0 to 5(mol %) of $P_2O_5$, and a total sum 0 to 20 (mol %) of $Al_2O_3$, CaO, BaO, and $P_2O_5$, which are contained in a ratio with respect to a whole of a glass compound in terms of oxides.

2. The lead-free conductive compound for the solar cell electrode according to claim 1, wherein the glass frit has an average particle diameter of 3.0 (μm) or less.

3. The lead-free conductive compound for the solar cell electrode according to claim 2, wherein the conductive powder includes silver powder.

4. The lead-free conductive compound for the solar cell electrode according to claim 1, wherein the conductive powder includes silver powder.

5. The lead-free conductive compound for the solar cell electrode according to claim 4, which includes the silver powder by 64 to 90 weight parts and the vehicle by 5 to 20 weight parts.

6. The lead-free conductive compound for the solar cell electrode according to claim 4, wherein the silver powder includes a powder in the form of a spherical shape and a flake shape in shape.

7. The lead-free conductive compound for the solar cell electrode according to claim 1, which is used as a light-receiving surface electrode and/or a rear surface electrode of the solar cell.

* * * * *